United States Patent [19]

Rothe

[11] Patent Number: 4,975,921

[45] Date of Patent: Dec. 4, 1990

[54] INTEGRATED PREPULSE CIRCUITS FOR EFFICIENT EXCITATION OF GAS LASERS

[75] Inventor: Dietmar E. Rothe, Cardiff, Calif.

[73] Assignee: Lasertechnics, Inc., Albuquerque, N. Mex.

[21] Appl. No.: 330,162

[22] Filed: Mar. 29, 1989

[51] Int. Cl.$^5$ ................................. H01S 3/00
[52] U.S. Cl. ................................. 372/38; 372/37
[58] Field of Search ....................... 372/38, 37

[56] References Cited

U.S. PATENT DOCUMENTS 4,275,317  6/1981  Laodenslager et al. ............... 372/88
4,763,336  8/1988  Stephens .............................. 378/88

Primary Examiner—Leon Scott, Jr.
Attorney, Agent, or Firm—William E. Hein

[57] ABSTRACT

Efficient impedance-matched gas laser excitation circuits integrally employ prepulse power generators. Magnetic switches are employed to both generate the prepulse and switch the prepulse onto the laser electrodes.

7 Claims, 5 Drawing Sheets

INTEGRATED PREPULSE CIRCUITS FOR EFFICIENT EXCITATION OF GAS LASERS

ORIGIN OF THE INVENTION

This invention was made with United States Government support under NASA Contract NAS 7-970 awarded by the National Aeronautics and Space Administration. The United States Government has certain rights in this invention.

DEFINITION OF TERMS

As used herein, the following terms shall have the associated meanings:

TE-LASER shall mean a transversely excited pulsed gas laser. The laser medium (gas) between two parallel electrodes is excited by applying a high voltage electric pulse to the electrodes. The resulting electric discharge is at right angles to the optical axis of the laser.

PFN shall mean a pulse-forming network, an electric network consisting primarily of capacitors and inductors that is designed to produce a desired output pulse shape.

PFL shall mean a pulse-forming line which makes use of distributed capacitances and inductances arranged in a linear geometry. A transmission line, the most common simple PFL, may consist of parallel metal plates (conductors) or coaxial metal tubes, the space between the conductors being filled with a high-permittivity ($\epsilon$) and/or a high-permeability ($\mu$) material. High voltage PFLs generally employ a high-permittivity material, such as deionized water or ferro-electric ceramics such as barium titanate or strontium titanate. A multitude of ceramic capacitors may be used to approximate a continuously distributed capacitance. Pulse-forming lines are most useful for producing rectangular, constant-voltage, constant-current output pulses.

MAGNETIC SWITCH shall mean an inductor with a saturable high-permeability ferro-magnetic core that has a near-rectangular hysteresis loop. The electric impedance of the inductor suddenly drops by orders of magnitude from a high value to a low value when the core saturates, permitting a sudden increase in electric current that effects a switching action. The magnetic switch generally consists of a toroidal or racetrack-shaped core made from a high-frequency ferrite material or wound from thin Metglas (trademark of Allied Signal Corp.) ribbon. It may have one or more electrical turns (wire or wide striplines) passing through the window of the core.

BACKGROUND OF THE INVENTION

This invention relates to pulsed-power excitation networks for optimum power transfer to electric gas laser discharges. The central problems affecting the performance of all high-pressure, self-sustained discharge excited gas lasers are discharge stability and uniformity. In addition, some TE-lasers, such as the rare gas-halide excimer lasers, require very high power densities on the order of 1 MW/cm$^3$ for effectively pumping the laser. These conditions place very high demands on the PFN used to provide the excitation pulse. In addition to providing the required high voltage and high power levels, it is necessary to use uniform-field electrodes, uniform preionization (by a form of ionizing radiation such as ultraviolet or x-ray radiation) and fast-rising voltage and current pulses having risetimes less than 50 nanoseconds, corresponding to dV/dt and dI/dt values in the range of $10^{12}$ to $10^{13}$ V/s and A/s.

In order to generate these pulses having fast risetimes directly, fast-closing low-inductance switches are required. Known high voltage, high current, fast switches, such as multichannel spark gaps, lack reliability and long life, however. Certain known magnetic pulse compression schemes make it possible to employ slower but more reliable switches, such as thyratrons, thyristors, SCRs, etc. See, for example, U.S. Pat. Ser. Nos. 4,275,317 entitled *Pulse Switching for High Energy Lasers* and 4,698,518 entitled *Magnetically Switched Power Supply System for Lasers*. See also D. L. Birx et al., *Basic Principles Government the Design of Magnetic Switches*, Lawrence livermore National Laboratories, UCID-18831 (November, 1980); I. Smilanski, S. R. Byron, T. R. Burkes, *Electrical Excitation of an XeCl Laser Using Magnetic Pulse Compression*, Appl. Phys. Lett. 40 (1982) 547; D. Basting et al., *Thyratrons with Magnetic Switches: The Key to Reliable Excimer Lasers*, Laser and Optoelektronik 2 (1984) 128; and T. Shimada, M. Obara, A. Noguchi, *An All Solid-State Magnetic Switching Exciter for Pumping Excimer Lasers*, Rev. Sci. Instrum. (November, 1985). In the magnetic pulse compression technique, a microsecond long pulse is first generated with a thyratron-switched circuit. The pulse is then compressed to approximately 100 microseconds by employing two or more compression circuits or stages in tandem. This approach produces sinusoidal voltage and current pulses, which do not permit impedance matching over the entire pulse duration for optimum energy transfer to the discharge plasma.

Since the electric discharge plasma represents approximately a constant voltage load, it is possible to maximize the energy transfer and the laser efficiency by pumping the discharge with a voltage-matched (impedance-matched) constant-voltage PFL. Impedance-matched conditions exist when the open circuit output voltage from the PFL is twice the steady state discharge voltage, $V_D$. Rapid electrical breakdown of the gas (electron avalanche formation time of less than 20 nanoseconds), however, requires that the applied voltage is three to five times $V_D$. See D. E. Rothe et al., *Efficiency Optimization of a Discharge-Excited XeCl Laser*, Final Tech. Report, ONR Contract N00014-82C-0087< Office of Naval Research, Arlington, Virginia (December, 1982) and D. E. Rothe, C. Wallace, T. Petach, *Efficiency Optimazation for Discharge-Excited High-Energy Excimer Laser*, AIP Conf. Proceed. No. 100, Subseries on Opt. Sci, & Engin. No. 3, Excimer Lasers 1983 (OSA, Lake Tahoe, Nev. 1983) 33. It is therefore necessary to prepulse the electrodes with a high-voltage, low-energy pulse to initiate the discharge in a timely fashion.

These so called "prepulse techniques" were developed in 1981 (See the two Rothe references, supra, and W. H. Long, M. J. Plummer, E. A. Stappaerts, *Efficient Discharge Pumping of an XeCl Laser Using a High-Voltage Prepulse*", Appl. Phys. Lett. 43 (1983) 735) and have since been the subject of various papers (see, in addition, R. S. Taylor, K. E. Leopold, *Magnetically Induced Pulser Laser Excitation*, Appl. Phys. Lett. 46 (1985) 335) and patents (U.S. Pat. Ser. Nos. 4,534,035 and 4,698,518). The prior art prepulse technique is illustrated schematically in FIG. 1, which shows a PFL being charged from a thyratron-switched pulse-charging unit with possible intermediate pulse compression stages. A magnetic isolation switch allows the high voltage prepulse to be applied to the laser electrodes from a separate prepulser, as described in the first Rothe reference, supra. Variations of this arrangement are known in the art. An arrangement with two laser discharge gaps operated in tandem eliminates the need for the isolation switch, as shown in U.S. Pat. Ser. No. 4,534,035. Another arrangement employs a saturable magnetic pulse transformer, which allows the prepulse to be coupled to one electrode through this transformer by magnetic induction. (See U.S. Pat. Ser. No. 4,698,518 and R. S. Taylor, K. E. Leopold, *Magnetically Induced Pulser Laser Excitation*, Appl. Phys. Lett. 46 (1985) 335).

In order to produce the necessary fast voltage and current risetimes, the prepulse generator must have a low output impedance of less than 10 ohms and must generate a fast voltage pulse with less than 50 nanoseconds risetime. In order to apply the prepulse effectively to one of the laser electrodes of FIG. 1, it is necessary to temporarily isolate the electrode from the PFL by means of a saturable magnetic inductor. This inductor ($L_3$) becomes partially saturated during activation of the PFL (i.e. during the charging of the PFL capacitance), and then is driven into full saturation by the prepulse. It should be noted that when using a separate prepulser, the prepulse must be of opposite polarity to the voltage supplied by the PFL, so that the magnetic switch $L_3$ becomes saturated for current flowing from the PFL to the discharge. The resulting field reversal in the discharge gap does not appear to be a problem and may even enhance the discharge stability. (See R. S. Taylor, *Preionization and Discharge Stability Study of Long Optical Pulse Duration UV-Preionized XeCl Lasers*, Appl. Phys. B (Springer) 41 (1986) 1). Peak voltage requirements for the prepulse are $4V_D+V^*_E$, where $V^*_E$ is the electrode voltage prior to application of the prepulse. In the prior art, the prepulse amplitude, therefore, had to be 100 kV or above, a condition which placed high demands on the low-impedance prepulse generator illustrated in FIG. 1.

Design of the magnetic isolation switch $L_3$ is difficult because it must have an extremely low saturated inductance of approximately 10 nanohenries. This inductance adds to the head inductance and thus controls the rate of current rise in the discharge. For a PFL output impedance of approximately 1 ohm, the combined inductance of the laser head and the magnetic isolation switch should not be much more than 10 nanohenries, or the benefits of a pulse-forming line are lost. Inductor $L_3$ should consist of a "racetrack" core around a wide current sheet (single turn). It must be made of a low-loss, high-frequency material to hold off the fast-rising prepulse voltage (>5 MHz). Annealed 15-micrometer thin Metglas ribbon (2705-MN or 2605-CO by Allied Signal Corporation) is a possible choice.

An alternative approach to the prepulse isolation problem is to replace the magnetic isolation switch $L_3$ with an auxilliary discharge by employing a three-electrode structure as described by D. E. Rothe, *Widely Tunable Gas Laser for Remote Sensing of Stratospheric Constituents*, Final Tech. Report (Rothe Technical Research Rept. No. 1), NASA-SBIR Contract No. NAS7-935, NASA/JPL (June, 1985).

SUMMARY OF THE INVENTION

The present invention is directed to integration of a low-impedance prepulse circuit such as that illustrated in FIG. 1 with a PFL and isolation switch. Such integration eliminates the need for a separate prepulse generator and its associated synchronization and triggering equipment.

The present invention is advantageous over the prior art in that an integrated prepulser, built close to the discharge electrodes, can more easily be made with a low impedance. Output impedances around the 1 ohm level are possible. This makes the prepulse application more effective and efficient.

Another advantage of the present invention is that the prepulse is switched in automatically by a saturable inductor at the peak of the charging pulse, thereby eliminating the need for another timed trigger pulse.

Yet another advantage of the present invention is that the isolation switch may also double as the switch which generates the prepulse, thus simplifying the PFN, as shown in FIG. 4. In this situation the magnetic switch does not have to oppose the prepulse in its unsaturated state. The V.t-product for this saturable inductor, and thus the core size, can be significantly reduced.

DETAILED DESCRIPTION OF THE PREFERRED EMBODIMENTS

Figure 1:
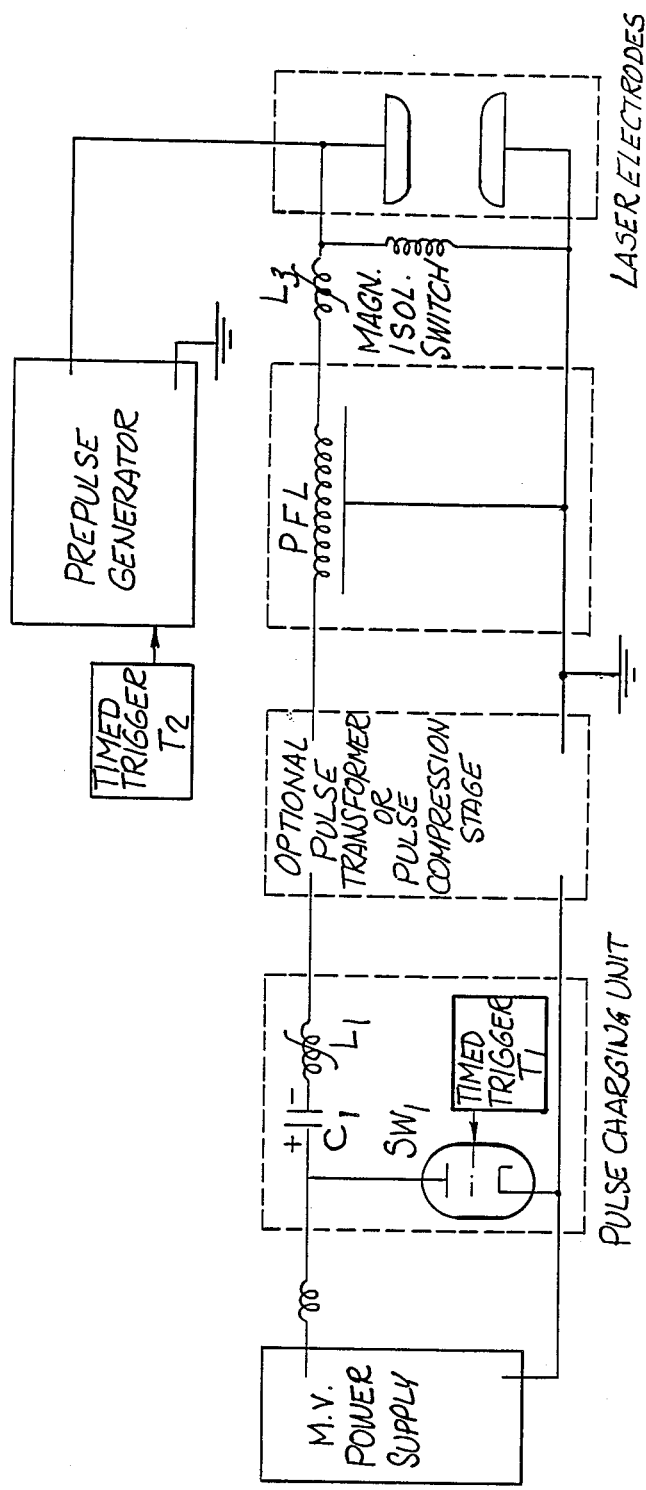
FIG. 1 is a schematic diagram of a typical prior art prepulse technique for exciting a high-frequency TE-laser employing two electrodes.
Figure 2:
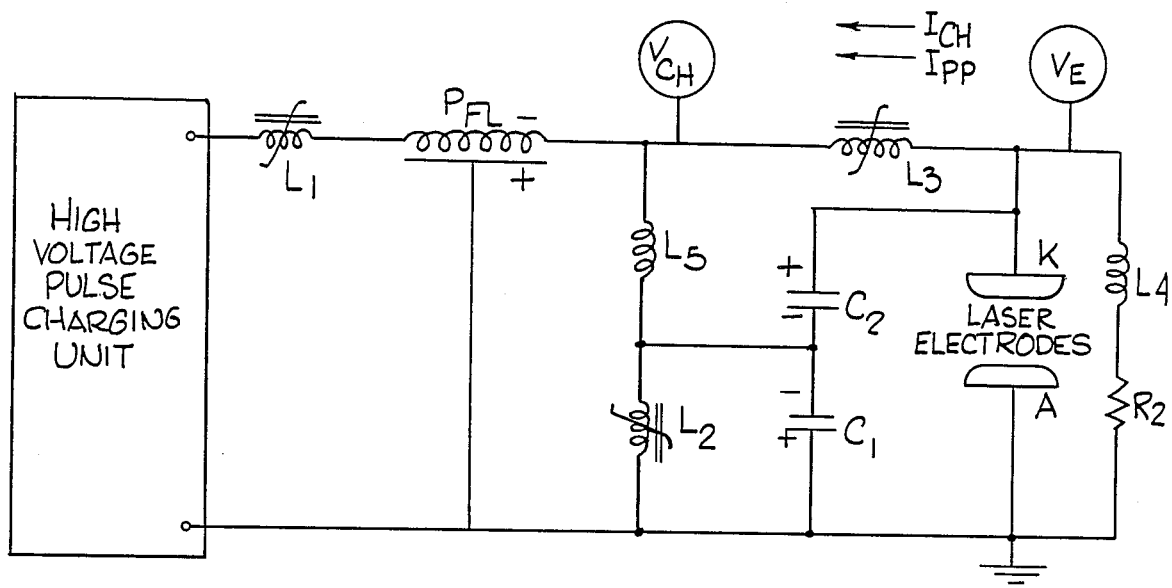
FIG. 2 is a schematic diagram of an integrated prepulse circuit, in accordance with the present invention, for producing a positive prepulse.
Figure 4:
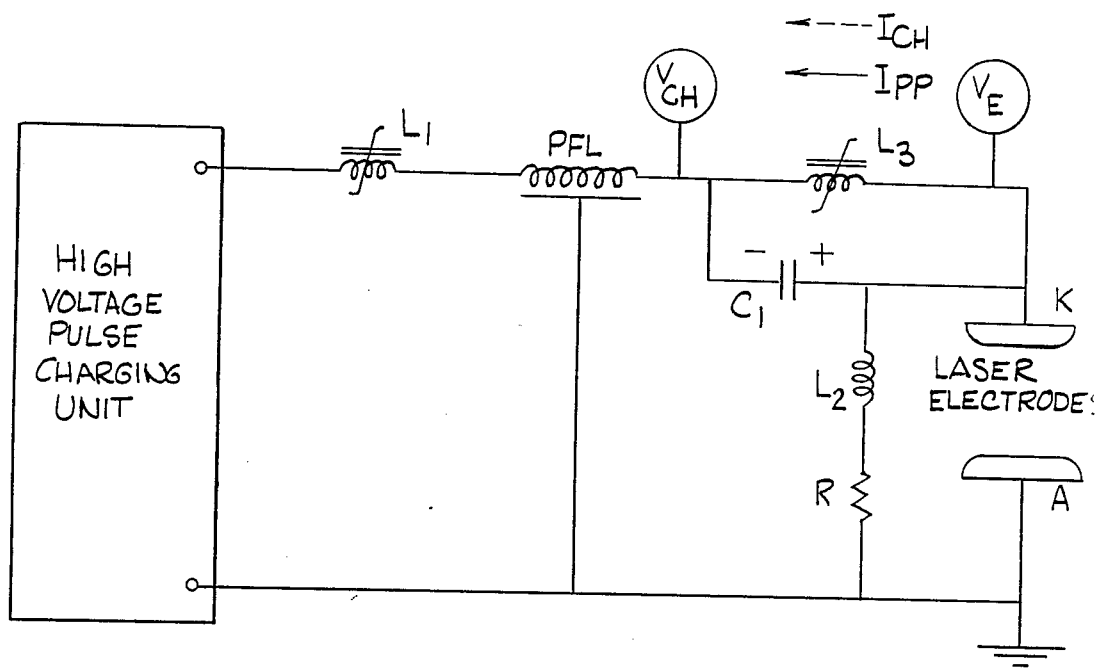
FIG. 4 is a schematic diagram of an integrated prepulse circuit, in accordance with the present invention, for producing a negative prepulse.
Figure 7:
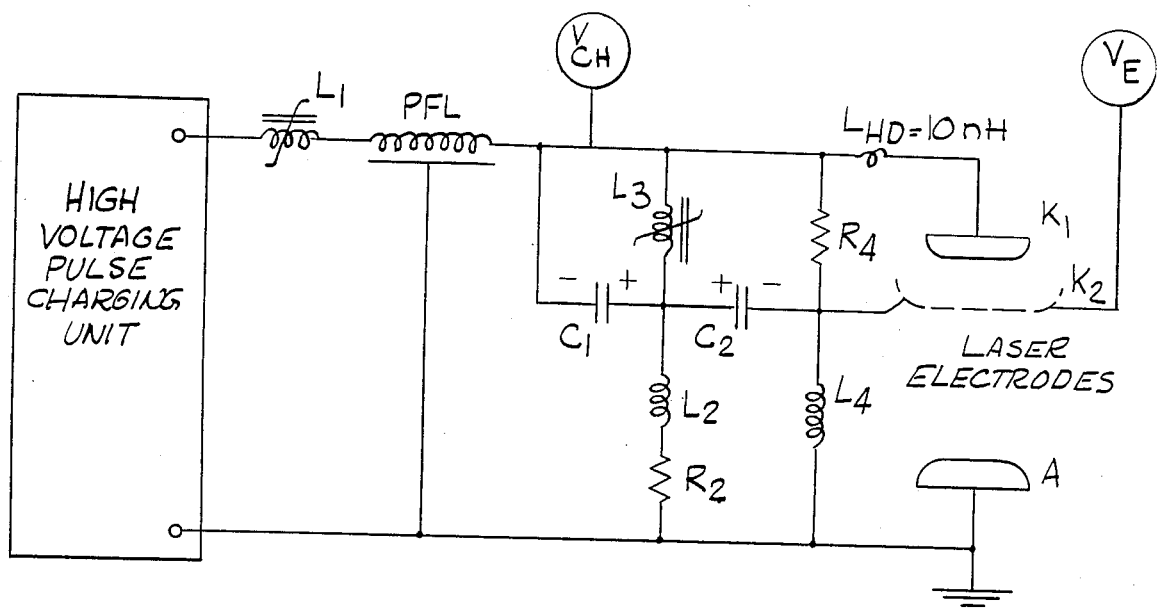
FIG. 7 is a schematic diagram of an integrated prepulse circuit, in accordance with the present invention, for producing a prepulse of either positive or negative polarity for exciting a high-frequency TE-laser employing three electrodes.

Referring now to FIG. 2, there is shown a schematic diagram of a PFL and an integrated prepulse generator. The prepulse circuit generates a positive prepulse just ahead of the negative discharge. In operation, the PFL is negatively charged to $V_{CH}$, which is typically between 20 kV and 40 kV, in a time period of approximately 1 microsecond. It should be noted that $V_{CH}$ and $V_E$, illustrated in FIGS. 2, 4, and 7, are labels to indicate measured voltages. Charging of the PFL is accomplished with a conventional high-voltage pulse charging unit. The charging inductor $L_1$, shown in FIG. 2, may comprise a conventional coil having an inductance of a few microhenries, or it may be a saturable-core reactor, which delays charging of the PFL until its core is magnetically saturated. A saturable inductor in this location is generally known as a "thyratron assist." It delays the onset of high values of current rate-of-rise (dI/dt) until the charging thyratron in the pulse charging unit has safely passed through its resistive turn-on phase.

The illustrated prepulse circuit, consisting principally of capacitors $C_1$ and $C_2$, and of saturable inductors $L_2$ and $L_3$, is an integral part of the PFN used to excite the laser discharge plasma. In this embodiment, the prepulse circuit comprises a voltage doubler, with $L_2$ being the generating switch. During the charging phase, when the PFL is being charged negatively, the capacitors $C_1$ and $C_2$ are also being charged to the polarities shown in FIG. 2, through charging inductor $L_5$.

The saturable core inductor $L_2$ is designed to have a voltage-time product which will make it saturate, and switch from a high to a very low impedance, just as the charging voltage $V_{CH}$ on the PFL reaches its maximum value. At this time, the circuit formed by capacitor $C_1$ and inductor $L_2$ becomes a high-frequency oscillator, which inverts the charge on capacitor $C_1$ in a time period given by the expression $pi*(C_1L_2)\cdot 5$. As the polarity of the charge on $C_1$ is inverted, a positive prepulse with amplitude $2V_{CH}$ is generated and applied to the laser discharge cathode K. Typical values for $C_1$ and $C_2$ are between 5 nF and 10 nF, as compared with a typical PFL capacitance of 150 nF.

Saturable inductor switch $L_3$ is designed to remain unsaturated and act as an isolation switch until the prepulse reaches its full amplitude. It should be noted that the current flows through the isolation switch $L_3$ in the same direction during charging of the PFL ($I_{CH}$), during application of the prepulse that results in saturation of its core ($I_{pp}$), and during discharge of the PFL into the laser plasma. Thus, the PFN is able to "dump" the energy stored in the PFL immediately after the prepulse saturates switch $L_3$. In order for the prepulse to effectively initiate the laser discharge, the saturated inductance of switch $L_2$ has to be less than 80 nH, while that of switch $L_3$ is required to be less than 20 nH, and preferably less than 10 nH. Switches $L_2$ and $L_3$ should, therefore, have no more than 1 or 2 electrical turns and the cores should be constructed from high-frequency, high-performance ferromagnetic materials, such as thin pre-annealed Metglas ribbon or high-frequency ferrites. Because these cores require a large voltage-time product of approximately $10^{-2}$ volt-seconds, the magnetic flux density $B_S$ at saturation must be approximately 1 Tesla (10,000 Gauss) or more. Furthermore, the relative unsaturated permeability of the core material must be around 1000, so that the saturated impedance $L_{SAT}$ drops to approximately 1/1000 of its unsaturated value $L_{US}$ at the time of saturation.

Figure 3:
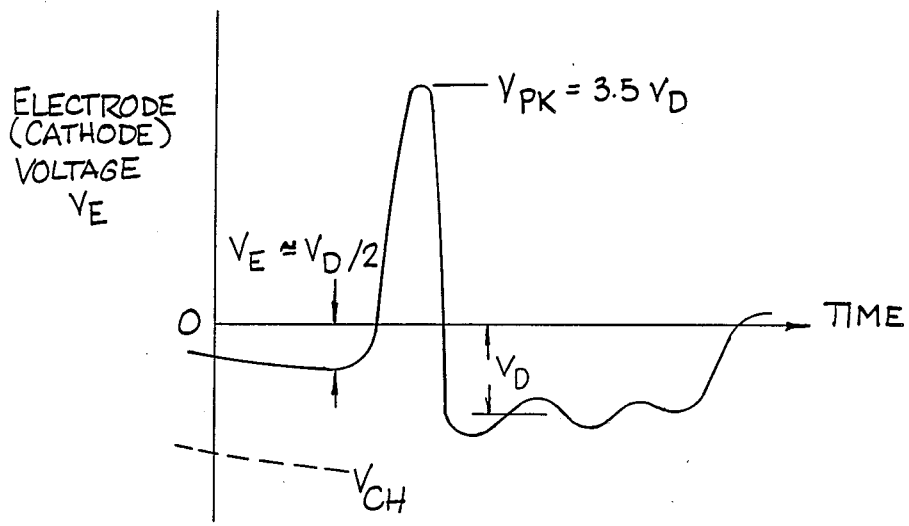
FIG. 3 is a waveform diagram showing a typical waveform of electrode voltage for the circuit of FIG. 2.

The waveform of the electrode voltage, $V_E$, generated by the circuit of FIG. 2, is shown in FIG. 3. Note that even though a voltage doubling arrangement is employed here, the peak prepulse voltage is only 3.5 times the steady-state discharge voltage $V_D$, because the positive prepulse has to overcome the pre-existing negative voltage of the charging pulse. Inductor $L_4$, in FIG. 2, is chosen to have a large impedance relative to the discharge impedance, but its inductance should be only a small fraction of the unsaturated inductance $L_{3US}$ of switch $L_3$. This allows the cathode voltage $V_E$ to remain small during charging of the PFL. For example, with $L_4$ equal to 4 microhenries and $L_{3US}$ equal to 12 microhenries, the electrode voltage prior to the prepulse is less than $V_{CH}/4$, or less than $V_D/2$ for a voltage and impedance-matched PFL. Damping resistor $R_2$ should be between 10 and 50 ohms.

As illustrated in FIG. 3, the electrode voltage starts at around $-(\frac{1}{2})V_D$ near the end of the charging cycle. The positive prepulse then takes the cathode potential up to $+3.5\ V_D$ in approximately 50 ns. This overvoltage is sufficient to drive the avalanche discharge into its fully conducting mode in another 30 ns (for an XeCl laser, for example). During the ensuing discharge, for the next 100 ns or more, the cathode voltage remains near $-V_D$, the steady-state discharge sustaining voltage. The voltage oscillations seen during the discharge phase are initiated by the prepulse circuit, which by necessity is overvoltaged and underdamped. These oscillations may be reduced by adding up to 1 ohm of damping resistance in the prepulse circuit. The damping resulting from the discharge (1 to 5 ohms) and from any series resistor will be more effective as the output impedance of the prepulser is lowered. With careful design, the effective output impedance of the prepulse circuit can be kept below 3 ohms. With a separate prepulser, as with the prior art, it is difficult to achieve an output impedance of less than 10 ohms.

A preferred prepulse circuit which generates a negative pulse is shown schematically in FIG. 4. Here, switch $L_3$ acts as both the isolation and the prepulse generating switch. Again, the charging inductor $L_2$ for charging the prepulse capacitor $C_1$ is chosen to be kept in relation to $L_{3US}$, in order to maintain the electrode voltage low prior to application of the prepulse and to maximize the charge on prepulse capacitor $C_1$. As before, the current through the isolation and prepulse generating switch $L_3$ is in the same direction during charging of the PFL ($I_{CH}$), during the prepulse generation ($I_{pp}$), and during the laser discharge phase. Once saturated, the isolation and prepulse generating switch $L_3$ will therefore freely pass the discharge current.

In this circuit, the core of isolation and prepulse generating switch $L_3$ must saturate at the beginning of the prepulse and must sustain a voltage of $V_{CH}=2V_D$ in its saturated state ($L_{3SAT}$). To prevent significant energy leakage from the prepulser back into the PFL, the effective impedance of the prepulser, $(L_{3SAT}/C_1)\cdot 5$ must be less than the PFL output impedance, which is typically between 1 and 10 ohms for most TE lasers. It is, thus, advantageous to maintain the PFL impedance large and $L_{3SAT}$ small (less than 20 nH). Otherwise, prepulse capacitor $C_1$ and the prepulse energy may be required to be unreasonably large.

The inductor $L_2$ may also be made a saturable reactor to delay charging of the prepulse capacitor $C_1$. The advantage would be a smaller voltage-time product and, thus, less core material for isolation and prepulse generating switch $L_3$. Also, the value of resistor R can be chosen significantly smaller than the critical damping resistance $(L_{2SAT}/C_1)\cdot 5$. This would allow prepulse capacitor $C_1$ to be charged (after $L_2$ saturates) to voltages well above $V_{CH}$, resulting in a higher prepulse amplitude.

Figure 5:
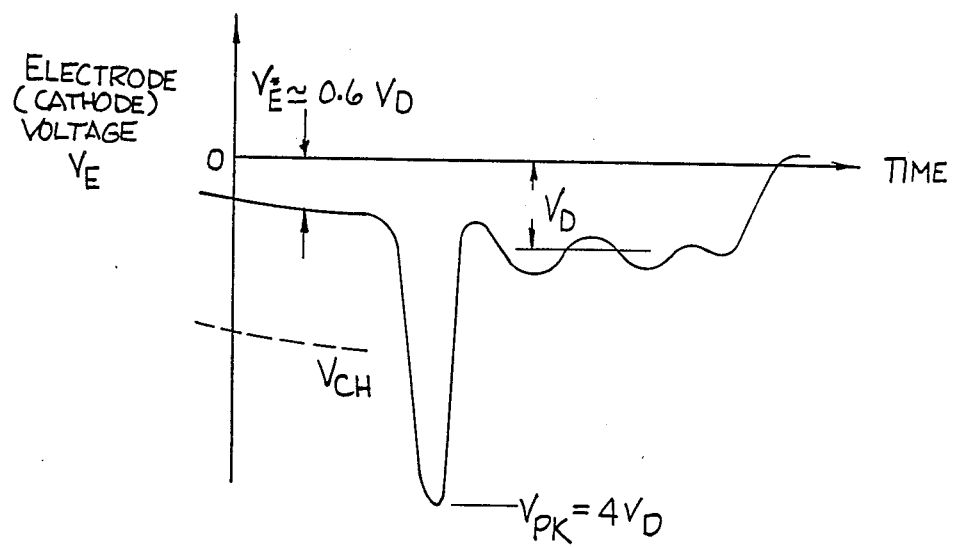
FIG. 5 is a waveform diagram showing a typical waveform of electrode voltage for the circuit of FIG. 4.

The cathode waveform, attainable with this prepulse circuit, is illustrated in FIG. 5. Since the charging voltage $V_{CH}$, the prepulse voltage $V_{PK}$, and the discharge voltage $V_D$ are all negative, it is relatively easy to achieve peak prepulse voltages of $-4V_D$ with careful component design. Rapid discharge initiation can thus be expected, followed by a steady-state discharge voltage at $V_E = -V_D$, as shown in FIG. 5.

Figure 6:
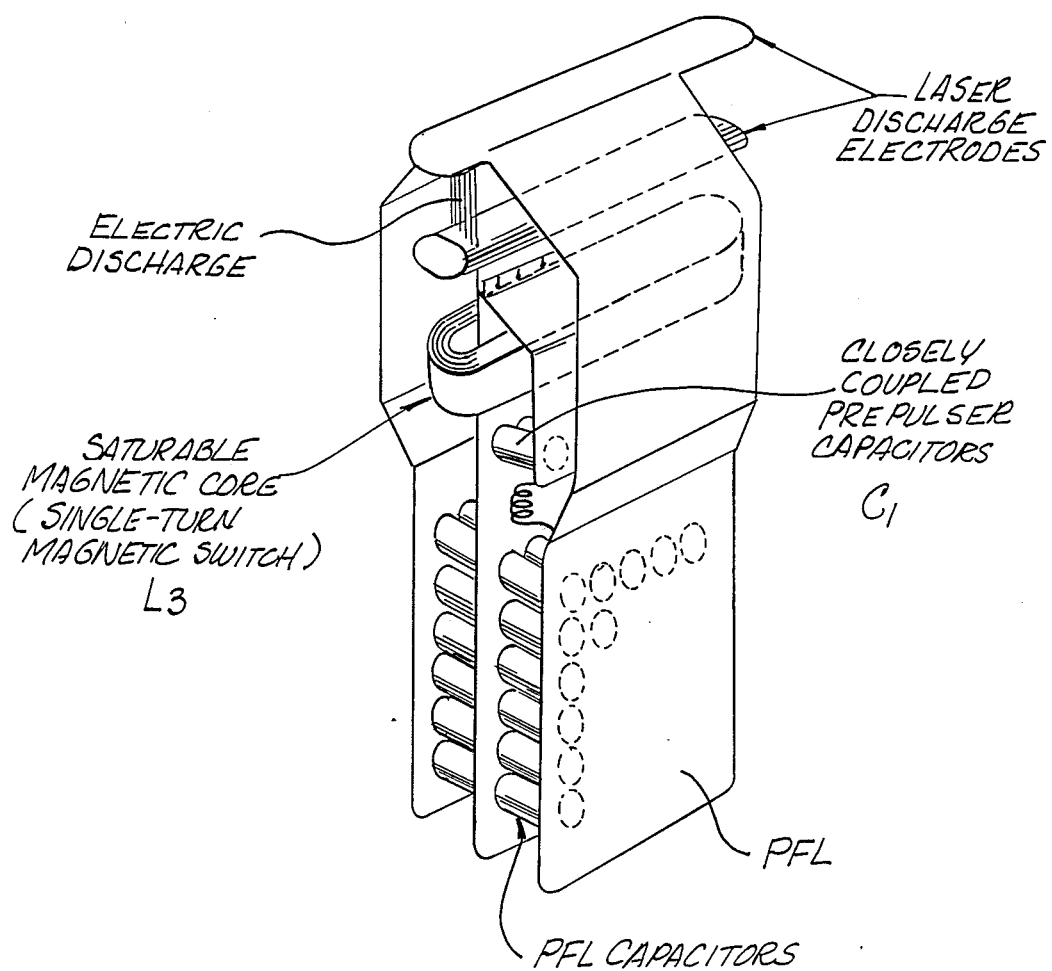
FIG. 6 is a diagram illustrating typical geometry for a parallel plate PFL employing an integrated prepulser like that shown in FIG. 4.

A physical arrangement, showing a parallel-plate PFL with the prepulser of FIG. 4, is illustrated in FIG. 6. In FIG. 6, the PFL is a double transmission line, made from ceramic capacitors sandwiched between copper plates. The saturable magnetic reactor $L_3$ is shown as a racetrack shaped core around a single electrical "turn" consisting of a copper plate passing through the core. Note the closely coupled prepulse capacitors $C_1$. The PFL, the prepulse circuit, and the connections to the laser electrodes have all been designed for minimum inductance.

The need for an isolation switch between the discharge cathode and the PFL, as illustrated in FIG. 2, may be eliminated by employing a three-electrode design, as shown in FIG. 7. The prepulse can then be applied to the intermediate electrode, shown in FIG. 7 as a secondary screen cathode $K_2$. This electrode geometry and prepulser arrangement has been tested successfully with a low-inductance ($L_{3SAT}=50$ nH) Metglas switch. In this embodiment, the prepulser consists of a voltage-doubling circuit, which can add twice the charging voltage to the voltage supplied by the PFL. The prepulse, with an amplitude of up to $3V_{CH}=6V_D$, is applied to electrode $K_2$ to overvolt the main discharge gap between secondary screen cathode $K_2$ and the anode A. The auxiliary discharge gap, between cathodes $K_1$ and $K_2$, is typically equal to $\frac{1}{3}$ of the main gap between electrodes $K_2$ and A.

During charging of the PFL to $V_{CH}=-2V_D$, the prepulse capacitors $C_1$ and $C_2$ are charged to the polarities shown. The inductance $L_2$ is small compared with the unsaturated inductance of saturable reactor $L_3$, thereby allowing capacitors $C_1$ and $C_2$ to charge to $V_{CH}$. When reactor $L_3$ saturates, the charge on capacitor $C_1$ is rapidly inverted, thus producing a strong negative pulse at the secondary screen cathode $K_2$. Inductor $L_2$ may also comprise a saturable-core reactor to delay charging of capacitors $C_1$ and $C_2$ to reduce the time required of reactor $L_3$ to oppose the charging voltage. As explained above, this arrangement will permit a substantial reduction in core size for reactor $L_3$.

Resistor $R_4$ and inductor $L_4$ form a voltage divider circuit to equalize the electric fields in the auxiliary gap ($K_1$–$K_2$) and the main discharge gap ($K_2$–A) during the microsecond long charging cycle. Typical values for these components are $R_4=15$ ohms and $L_4=50$ microhenries. Inductor $L_{HD}$ is the laser "head inductance," which should be kept small to permit the discharge current to rise quickly.

Figure 8:
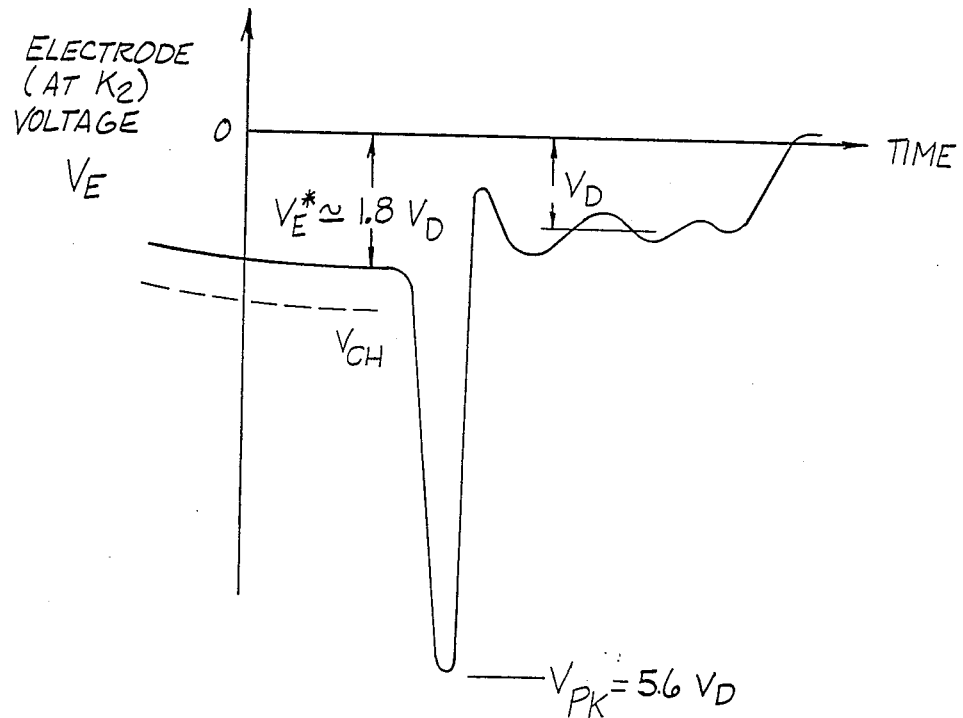
FIG. 8 is a waveform diagram showing a typical waveform of electrode voltage for the circuit of FIG. 7.

The voltage waveform at the secondary screen cathode $K_2$ just prior to, during, and after prepulse application, is shown in FIG. 8. Initially, the voltage on that electrode is between 1.5 $V_D$ and 1.8 $V_D$, as determined by the voltage divider comprising resistor $R_4$ and inductor $L_4$. As inductor $L_3$ saturates, its inductance changes from a high value (typically 50 microhenries) to a low value of 50 nH or less. This generates a fast-rising negative prepulse with a risetime of less than 50 ns and an amplitude of over $-5V_D$. The discharge in the main discharge gap is thereby quickly established. The duration of the subsequent steady-state discharge at $V_E=-V_D$ is determined by the "electrical length" of the PFL (typically 100 ns to 300 ns).

Whereas a three-electrode structure places lower demands on the magnetic switches, a two-electrode design can be made more rugged with a potentially longer life.

I claim:

1. An integrated magnetically switched prepulse generator and pulse forming network for exciting a laser medium, the apparatus comprising:

high voltage pulse charging means having first and second output terminals for providing energy to initially charge the prepulse generator and the pulse forming network;

a charging inductor connected to said first output terminal of said high voltage pulse charging means to control the rate of charging of the prepulse generator and the pulse forming network;

a pulse-forming line having first, second and third terminals, said first terminal being connected to said charging inductor and said third terminal being connected to said second output terminal of said high voltage pulse charging means, said pulse-forming line providing a sustaining voltage in a discharge in the laser medium;

a saturable inductor switch connected between said second terminal of said pulse forming line and a laser discharge cathode for preventing a high voltage pulse formed by the prepulse generator from leaking back to the pulse-forming line;

a pair of capacitors connected serially in back-to-back configuration between said laser discharge cathode and a laser anode, said laser anode being connected to said second output terminal of said high voltage pulse charging means, said pair of capacitors storing energy required for forming said high voltage pulse;

a saturable core inductor connected between a point of interconnection between said pair of capacitors and said second output terminal of said high voltage pulse charging means, said saturable core inductor forming said high voltage pulse upon core saturation; and a series inductor and damping resistor connected between said laser discharge cathode and said laser anode.

2. An integrated magnetically switched prepulse generator and pulse forming network for exciting a laser medium as in claim 1 wherein the capacitance of said pair of capacitors is in the range of 5 nanofarads to 10 nanofarads.

3. An integrated magnetically switched prepulse generator and pulse forming network for exciting a laser medium as in claim 1 wherein the saturated inductance of said saturable core inductor is less than 80 nanohenries.

4. An integrated magnetically switched prepulse generator and pulse forming network for exciting a laser medium as in claim 3 wherein the saturated inductance of said saturable inductor switch is less than 20 nanohenries.

5. An integrated magnetically switched prepulse generator and pulse forming network for exciting a laser medium, the apparatus comprising:

high voltage pulse charging means having first and second output terminals, a laser anode being connected to said second output terminal, said high voltage pulse charging means providing energy to initially charge the prepulse generator and the pulse forming network;

a charging inductor connected to said first output terminal of said high voltage pulse charging means to control the rate of charging of the prepulse generator and the pulse forming network;

a pulse forming line having first, second, and third terminals, said first terminal being connected to said charging inductor and said third terminal being connected to said second output terminal of said high voltage pulse charging means, said pulse forming line providing a sustaining voltage in a discharge in the laser medium;

an isolation and prepulse generating switch connected between said second terminal of said pulse forming line and a laser discharge cathode for forming a high voltage pulse upon core saturation; and a prepulse capacitor connected across said isolation and prepulse generating switch, said prepulse capacitor storing energy required for forming said high voltage pulse.

6. An integrated magnetically switched prepulse generator and pulse forming network for exciting a laser medium as in claim 5 wherein:

said pulse forming line comprises a double transmission line having a plurality of ceramic capacitors sandwiched between a central copper plate and a pair of parallel copper plates positioned on either side of said central copper plate; and said isolation and prepulse generating switch comprises a racetrack shaped core around said central copper plate.

7. An integrated magnetically switched prepulse generator and pulse forming network for exciting a laser medium in a three-electrode configuration, the apparatus comprising:

high voltage pulse charging means having first and second output terminals, a laser anode being connected to said second output terminal, said high voltage pulse charging means providing energy to initially charge the prepulse generator and the pulse forming network;

a charging inductor connected to said first output terminal of said high voltage pulse charging means to control the rate of charging of the prepulse generator and the pulse forming network;

a pulse forming line having first, second, and third terminals, said first terminal being connected to said charging inductor and said third terminal being connected to said second output terminal of said high voltage pulse charging means, said pulse forming line providing a sustaining voltage in a discharge in the laser medium;

a prepulse generating switch having first and second terminals, said first terminal being connected to said second terminal of said pulse forming line, said prepulse generating switch being operative for forming a high voltage pulse upon core saturation;

a first prepulse capacitor connected across said prepulse generating switch;

a second prepulse capacitor connected between said second terminal of said prepulse generating switch and a secondary screen cathode of a laser, said first and second prepulse capacitors storing energy required for forming said high voltage pulse;

a series inductor and damping resistor connected between said second terminal of said prepulse generating switch and said second output terminal of said high voltage pulse charging means; and voltage divider means comprising a dividing resistor connected between said second terminal of said pulse forming line and said secondary screen cathode and a dividing inductor connected between said secondary screen cathode and said second output terminal of said high voltage pulse charging means, said voltage divider preventing premature breakdown of said laser medium.

* * * * *